US009882346B2

(12) United States Patent
Gronenborn et al.

(10) Patent No.: US 9,882,346 B2
(45) Date of Patent: Jan. 30, 2018

(54) LASER MODULE WITH SIMPLIFIED ALIGNMENT

(71) Applicant: KONINKLIJKE PHILIPS N.V., Eindhoven (NL)

(72) Inventors: Stephan Gronenborn, Eindhoven (NL); Gero Heusler, Eindhoven (NL); Ralf Gordon Conrads, Eindhoven (NL); Holger Moench, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/104,599

(22) PCT Filed: Dec. 10, 2014

(86) PCT No.: PCT/EP2014/077098
§ 371 (c)(1),
(2) Date: Jun. 15, 2016

(87) PCT Pub. No.: WO2015/091117
PCT Pub. Date: Jun. 25, 2015

(65) Prior Publication Data
US 2016/0315447 A1    Oct. 27, 2016

(30) Foreign Application Priority Data

Dec. 20, 2013 (EP) .................... 13199005

(51) Int. Cl.
*H01S 5/024* (2006.01)
*H01S 5/022* (2006.01)
(Continued)

(52) U.S. Cl.
CPC ...... *H01S 5/02476* (2013.01); *H01S 5/02268* (2013.01); *H01S 5/02288* (2013.01);
(Continued)

(58) Field of Classification Search
CPC .. H01S 5/0202; H01S 5/02476; H01S 5/4031; H01S 5/423
See application file for complete search history.

(56) References Cited

U.S. PATENT DOCUMENTS 5,043,796 A * 8/1991 Lester ................. H01L 23/3735
257/717
5,920,584 A * 7/1999 Dohle ................... H01S 5/4025
372/36
(Continued)

FOREIGN PATENT DOCUMENTS

JP    11220204 A    8/1999
JP    H11220204  *  8/1999
(Continued)

*Primary Examiner* — Michael Carter (57) ABSTRACT

The invention describes carrier structure (100, 200) for assembling a semiconductor lighting module, comprising at least two sub carriers (110, 210) and an alignment structure (120, 130, 230, 232) mechanically coupling the sub carriers (110, 210). The alignment structure (120, 130, 230, 232) is adapted such that the mechanical coupling to at least a part of the sub carriers (110, 210) disappears during thermal mating the carrier structure (100, 200) on a carrier (110, 250). The alignment structure (120, 130, 230, 232) is further adapted to compensate a coefficient of thermal expansion of a material of the carrier (110, 250) being higher than a coefficient of thermal expansion of a material of the carrier structure (100, 200). The invention further describes a semiconductor chip comprising such a carrier structure (100, 200) and a semiconductor lighting module comprising the carrier structure (100, 200) or the semiconductor chip. The invention finally describes a corresponding method of manufacturing a semiconductor lighting module. The invention enables assembling of semiconductor lighting modules by thermal mating with reduced alignment effort.

23 Claims, 5 Drawing Sheets

(51) Int. Cl.
 *H01S 5/02* (2006.01)
 *H01S 5/42* (2006.01)
 *H01L 23/50* (2006.01)
 *H01L 23/544* (2006.01)

(52) U.S. Cl.
 CPC .......... *H01S 5/02469* (2013.01); *H01L 23/50* (2013.01); *H01L 23/544* (2013.01); *H01L 2223/54426* (2013.01); *H01L 2223/54486* (2013.01); *H01L 2924/0002* (2013.01); *H01S 5/0202* (2013.01); *H01S 5/423* (2013.01)

(56) References Cited

U.S. PATENT DOCUMENTS

| | | |
|---|---|---|
| 7,792,173 B2 | 9/2010 | Iga et al. |
| 8,130,807 B2 | 3/2012 | Schulz-Harder et al. |
| 2002/0076841 A1 | 6/2002 | Chang et al. |
| 2002/0172244 A1 | 11/2002 | Li et al. |
| 2003/0026303 A1* | 2/2003 | Ouchi ................. H01S 5/02272 372/36 |
| 2010/0293880 A1 | 11/2010 | Reichartz |
| 2013/0272330 A1 | 10/2013 | Joseph et al. |
| 2014/0348192 A1 | 11/2014 | Pruijmboom et al. |
| 2015/0036343 A1 | 2/2015 | Sorg et al. |

FOREIGN PATENT DOCUMENTS

| | | |
|---|---|---|
| WO | 0108219 A1 | 2/2001 |
| WO | 2009101551 A1 | 8/2009 |

\* cited by examiner

LASER MODULE WITH SIMPLIFIED ALIGNMENT

CROSS-REFERENCE TO PRIOR APPLICATIONS

This application is the U.S. National Phase application under 35 U.S.C. § 371 of International Application No. PCT/EP2014/077098, filed on Dec. 10, 2014, which claims the benefit of EP Patent Application No. EP 13199005.3, filed on Dec. 20, 2013. These applications are hereby incorporated by reference herein.

FIELD OF THE INVENTION

The invention relates to a carrier structure for assembling a semiconductor lighting module. The carrier structure may comprise submounts for mounting semiconductor light sources. Alternatively the carrier structure may be part of a semiconductor chip comprising semiconductor light sources. The invention further relates to a method of manufacturing a semiconductor lighting module using the carrier structure.

BACKGROUND OF THE INVENTION

Soldering of VCSEL arrays to a heat sink or a submount creates stress due to the CTE mismatch between the two components. This limits the maximum chip area that can be soldered with good reliability. Furthermore, the effort to align the VCSEL arrays to optical elements like micro lens arrays which may be needed to shape and collimate the beams of the VCSELs increases.

U.S. Pat. No. 7,792,173 B2 discloses a multi-beam semiconductor laser device in which relative difference in shear strain applied to each of light-emitting portions of a laser chip mounted on a submount is suppressed.

The effort of assembling the described multi-beam semiconductor laser device is still high.

SUMMARY OF THE INVENTION

It's thus an object of the present invention to reduce assembling effort of a semiconductor lighting module.

According to a first aspect a carrier structure for assembling a semiconductor lighting module is proposed. The carrier structure comprises at least two sub carriers and an alignment structure mechanically coupling the sub carriers. The alignment structure is adapted such that the mechanical coupling to at least a part of the sub carriers disappears or is released during thermal mating the carrier structure on a carrier if compressive stress exerted on the carrier structure exceeds a threshold value. The alignment structure is further adapted to compensate a coefficient of thermal expansion of a material of the carrier being higher than a coefficient of thermal expansion of a material of the carrier structure.

The carrier structure may enable assembling of semiconductor lighting modules by thermal mating with reduced alignment effort. Thermal mating means technologies for providing a permanent coupling between two or more separate parts by means of heat as, for example, soldering, silver sintering or the like. Two, three, four or more sub carriers are aligned to each other by means of mechanical coupling of the sub carries. The coupling may be provided by means of alignment structures which may consist of the same and/or different materials as the sub carriers. Part of the material of the alignment structure may, for example, vaporize during the heating process. The alignment structures may alternatively consist out of the same material as the sub carriers. The material between the sub carriers may be weakened in a way that it, for example, breaks preferably during the cooling phase of thermal mating. The material has to be weakened in a way that the sub carries are enabled to approach to each other during the cooling phase of thermal mating without touching each other. Alternatively or in addition the material between the sub carriers may be completely removed and the alignment structure may be arranged around the sub carries providing a kind of common suspension of the sub carriers inhibiting a relative movement of the sub carriers. The carrier structure can thus be placed on a number of, for example, soldering dots of the carrier. Solder placed on the soldering dots melts during the heating phase and forms separate joints to corresponding solder dots of the sub carriers. The solder solidifies during the cooling phase such that the carrier, which may be a heat sink, exerts a compressive stress to the carrier structure due to a higher coefficient of thermal expansion (CTE) of the material of the carrier in comparison to the CTE of the carrier structure. The mechanical coupling to the sub carriers provided by the alignment structure is at least partly destroyed or removed if the compressive stress exceeds a threshold value. The alignment structure may enable a linear or two dimensional (2 by 2, 2 by 3, 4 by 4 etc.) arrangement of sub carriers. The semiconductor lighting element may comprise light emitting diodes or laser diodes which may be arranged in arrays. Laser diodes may be side emitters or Vertical Cavity Surface Emitting Laser (VCSEL). VCSEL can be manufactured in wafer based processes such that one semiconductor chip may comprise a multitude of VCSELs or even VCSEL arrays.

The sub carriers of the carrier structure may be submounts for mounting semiconductor light sources as, for example, VCSEL arrays. The alignment structure may comprise at least one first frame structure and at least one bridge per submount mechanically coupling the submount to the first frame structure such that the submounts are arranged in parallel to the first frame structure and the bridges are adapted such that at least a part of the bridges to the submounts break during thermal mating the carrier structure to the carrier. The carrier structure, the submounts and the bridges may be made of one material which has a lower CTE as a heat sink which may be used as carrier where the submounts may be mounted on. The carrier structure may for example be diced from one sheet of Aluminum nitride (AlN). The first frame structure may enable a linear arrangement of submounts. The length and width and thus the stability of the bridges may depend on the distance to a center of the carrier structure such that, for example, the mechanical coupling to sub carriers near to the center of the carrier structure may be weaker in comparison to the mechanical coupling to sub carriers farther away from the center of the carrier structure. This may be used in order to take into account the different forces during cooling exerted to the bridges depending on the geometry of the carrier structure.

The mechanical stability of the carrier structure may be increased by means of second frame structure and at least one bridge per submount mechanically coupling the submount to the second frame structure such that the submounts are arranged in parallel to the second frame structure and the bridges are adapted such that at least a part of the bridges to the submounts break during thermal mating the carrier structure on the carrier. The sub carriers are in this case arranged between the first and the second frame structure.

The carrier structure may further comprise at least one first alignment frame with at least one alignment hole and at least one bridge mechanically coupling at least one submount or at least one frame structure to the first alignment frame. The first alignment frame in combination with the alignment hole may simplify the alignment of the carrier structure to the carrier. The carrier may comprise a marking which corresponds to the alignment hole in order to support the alignment of the carrier structure to the carrier prior to thermal mating of the carrier structure to the carrier. The carrier structure may further comprise a second alignment frame with at least one alignment hole and at least one bridge mechanically coupling at least one submount or at least one frame structure to the second alignment frame. The second alignment structure with the second alignment hole may further reduce the degrees of freedom of the carrier structure during positioning of the carrier structure on the carrier. The bigger the distance between the alignment holes is the smaller the alignment deviations are. The size of the carrier structure in comparison to single sub carriers may reduce misalignment.

The alignment structure of the carrier structure may comprise instead of the bridges one or more stabilizers coupling the submounts to the first frame structure. The stabilizers may vaporize during the heating phase of thermal mating or the solidification temperature of the stabilizers may be lower as the solidification temperature of the solder or silver paste. The stabilizers may also provide a mechanical coupling to a second frame structure, a first alignment frame and/or second alignment frame. Stabilizers may be advantageous in case of two dimensional arrays of sub carriers.

A semiconductor chip may comprise the carrier structure. The semiconductor chip may comprise semiconductor light sources as LEDs or laser diodes provided on the sub carriers. The carrier structure comprises at least parts of a substrate of the semiconductor chip and the alignment structure comprises a breaking line between at least a first sub carrier and a second sub carrier. Several arrays of VCSEL may be manufactured on a GaAs substrate. The breaking line may be arranged between the arrays such that the parts of the substrate where the VCSEL arrays are provided on are sub carriers. The sub carriers are separated by the breaking lines enabling linear as well as two dimensional arrays. The breaking lines of the alignment structure usually break after solidification of the solder, silver paste or the like during thermal mating. The compressive stress exerted by carrier with higher CTE causes breaking of the breaking line if a threshold value is exceeded. The carrier may be, for example, a heat sink like a copper microchannel cooler or a submount.

The breaking line of the alignment structure may comprise holes or trenches in the substrate. The holes or trenches may be provided by etching, drilling, dicing or the like. The holes or trenches are arranged such that the residual structures of the breaking line after breaking during thermal mating can approach each other without colliding. The residual structures may be arranged such that they overlap essentially without touching each other after finalizing thermal mating.

The holes may, for example, be provided along at least two parallel lines and the holes of the first line may be arranged staggered to the holes of the second line. An extension of the holes in parallel to the lines may be bigger than a joint between two holes in the lines such that the joints of the first line can slide in a corresponding hole of the second line and joints of the second line can slide in a corresponding hole of the first line during thermal mating the carrier structure to the carrier.

The semiconductor chip may comprise in an alternative approach at least two trenches, a first trench may be provided at the light emitting side of the semiconductor chip and a second trench may be provided at the side opposite to the light emitting side of the semiconductor chip in parallel to the first trench, and the depth of the first and the second trench is arranged in a way such that both trenches overlap within the substrate. The overlapping part of the trenches may provide a thin wall or bridge separating both trenches. The wall may be arranged in a way that it breaks after solidification of the solder, sintered silver paste or the like due to the compressive stress induced by the carrier. The residuals of the breaking line are enabled to slide one above another essentially without touching each other until thermal equilibrium is reached. Three or more trenches may increase the distance which may be provided between the different sub carriers. Alternatively or in addition, the width of the trenches may be adapted.

A semiconductor lighting module may comprise at least two sub carriers of a carrier structure thermally mated to a heat sink and at least two semiconductor light sources provided on different sub carriers. The sub carriers may be submounts or parts of a substrate of a semiconductor chip as described above. The semiconductor lighting module may further comprise submounts thermally mated to the heat sink and sub carriers of a semiconductor chip thermally mated to the submounts. The semiconductor chips and the submounts may be thermally mated in one common manufacturing step or in subsequent steps. The semiconductor lighting element may comprise LEDs or laser diodes like VCSELs which may be arranged in arrays. An optical device may be provided on top of the light emitting side of the semiconductor light sources. The optical device may be a microlens array for beam shaping the light emitted by, for example, VCSELs of VCSEL arrays.

According to a further aspect a method of manufacturing a semiconductor lighting module is provided. The method comprises the steps of:
  providing a carrier structure comprising at least two sub carriers and an alignment structure mechanically coupling the sub carriers, the alignment structure being adapted such that the mechanical coupling to at least a part of the sub carriers disappears during thermal mating the carrier structure on a carrier, wherein the alignment structure is arranged to compensate a coefficient of thermal expansion of a material of the carrier being higher than a coefficient of thermal expansion of a material of the carrier structure;
  providing at least two semiconductor light sources on the sub carriers; and
  thermal mating the carrier structure to the carrier.

The method may enable a simpler manufacturing of semiconductor lighting modules by reducing the alignment effort between, for example, several separate VCSEL sub arrays by creating, for example, one or several predetermined breaking points or lines in a large VCSEL array. The large VCSEL array can be placed as a whole and breaks during thermal mating. As the breakage happens after the solder, sintered silver paste or the like is solidified (during the cooling down phase), the position of the VCSELs on the different parts of the VCSEL array are still defined by the original geometry of the former large array, allowing to align one large lens array in front of all parts of the former large VCSEL array in one step, instead of using several small lens arrays which have to be aligned one after the other in a complex and time consuming way. The method may thus comprise the further step of attaching one or more optical devices like microlens arrays to the VCSEL arrays.

It shall be understood that the semiconductor lighting module and the method of manufacturing of semiconductor lighting modules have similar and/or identical embodiments, in particular, as defined in the dependent claims.

It shall be understood that a preferred embodiment of the invention can also be any combination of the dependent claims with the respective independent claim. Especially the frame structure, bridges etc. discussed with respect to the submounts may be used in combination with the semiconductor chip. Furthermore, the trenches and holes discussed with respect to the semiconductor chip may be used in combination with the submounts.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
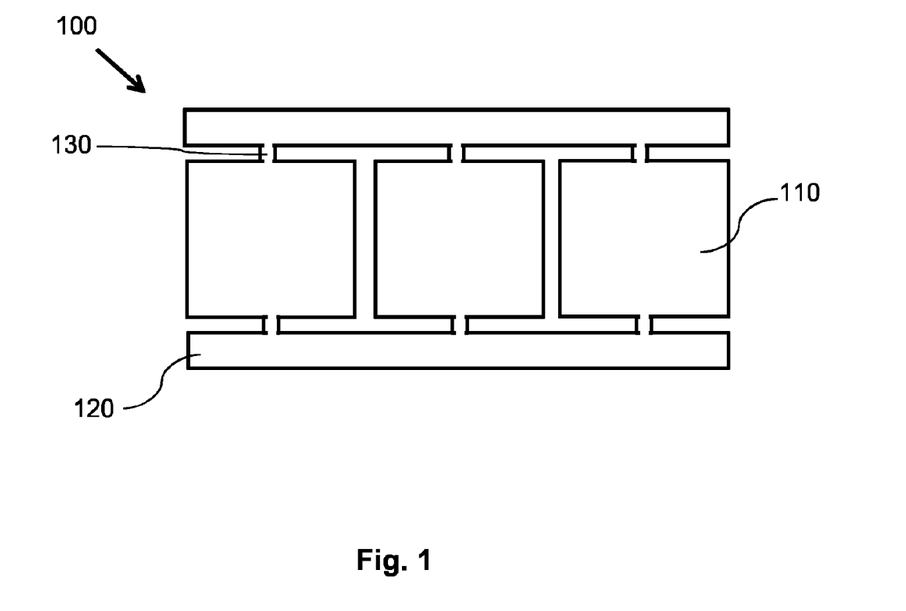
FIG. 1 shows a principal sketch of a first embodiment of a carrier structure.

FIG. 1 shows a principal sketch of a first embodiment of a carrier structure 100. The three sub carriers 110 of the carrier structure 100 are submounts for mounting semiconductor chips with one or more VCSEL arrays. The alignment structure comprises a first and a second frame structure 120 and two bridges 130 per submount mechanically coupling the submount to the first and the second frame structure 120. The submounts are arranged in a linear array between the first and second frame structure 120 and at least a part of the bridges are adapted to break during thermal mating of the carrier structure 100 to a carrier. The carrier structure, the submounts and the bridges are made of one material which has a lower CTE as a heat sink which may be used as carrier where the submounts may be mounted on. The four bridges 130 to the outer submounts on the left and the right side of the carrier structure 100 will be stressed during cooling down caused by compressive stress exerted to the carrier structure 100 by means of the carrier with a higher CTE. The four bridges 130 break if the stress exceeds a threshold value. The two bridges 130 to the submount in the middle of the carrier structure 100 are essentially not stressed during cooling down such that these two bridges 130 may not break. The residual bridges 130 may be manually or automatically removed after thermal mating of the submounts. The carrier structure 100 is made from one sheet of Aluminum nitride (AlN) which is manufactured by laser processing.

Figure 2:
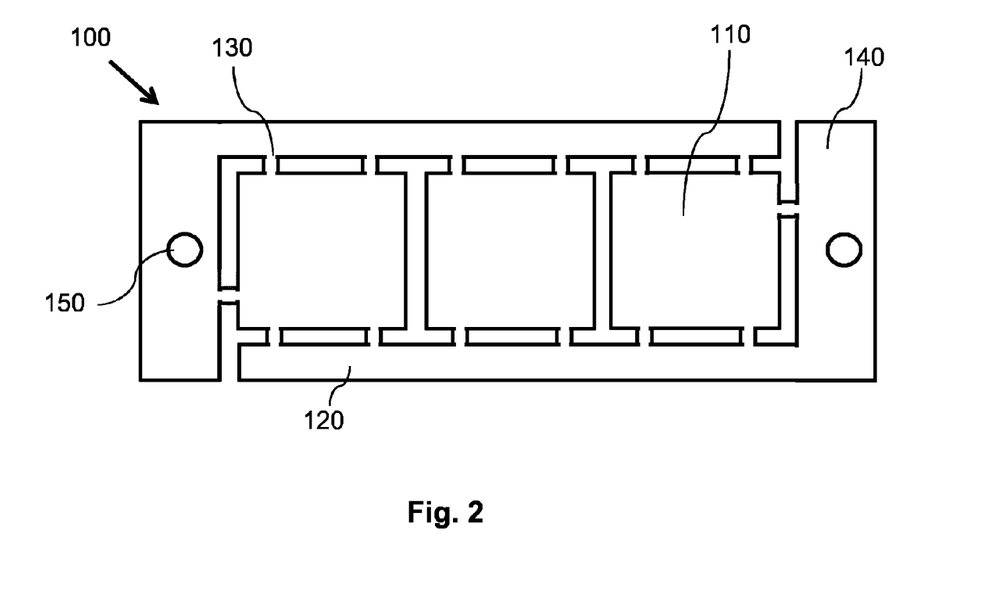
FIG. 2 shows a principal sketch of a second embodiment of a carrier structure.

FIG. 2 shows a principal sketch of a second embodiment of a carrier structure 100. The carrier structure 100 comprises in addition to the first and second frame structure 120 a first and a second alignment frame 140. The first alignment frame 140 is directly mechanically coupled to the first frame structure 120. The second alignment frame 140 is directly mechanically coupled to the second frame structure 120. The first alignment frame 140 on the left side of the carrier structure 100 is mechanically coupled to the left submount by means of one bridge 130. The second alignment frame 140 on the side side of the carrier structure 100 is mechanically coupled to the right submount by means of one bridge 130. Both alignment frames 140 comprise one alignment hole 150 arranged along a center line of the linear arrangement of submounts. The alignment frames 140 may simplify the handling of the carrier structure 100 and the alignment holes 150 may be used in combination with corresponding markings on the carrier to a align the submounts prior to thermal mating. The three sub carriers 110 are submounts which are by means of four bridges 130 mechanically coupled to the first and the second frame structure 120 (two bridges per frame structure 120).

Figure 3:
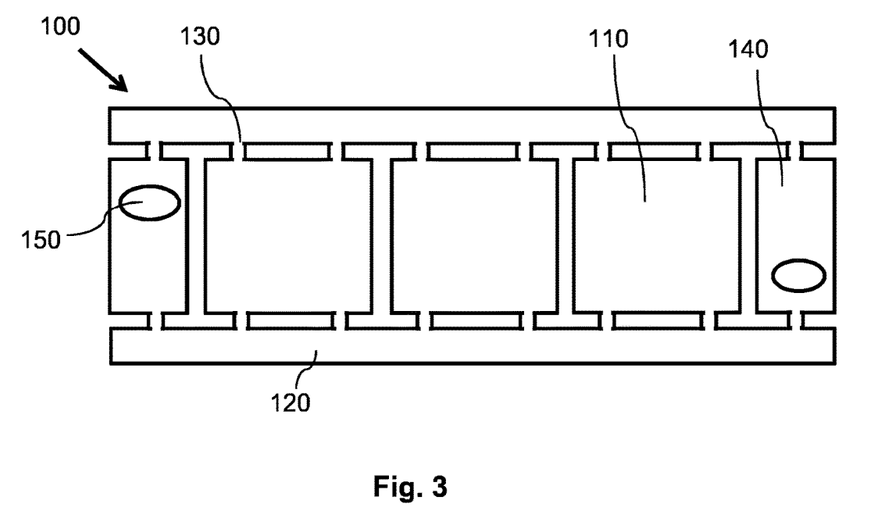
FIG. 3 shows a principal sketch of a third embodiment of a carrier structure.

FIG. 3 shows a principal sketch of a third embodiment of a carrier structure 100 which is similar to the embodiment shown in FIG. 2. The alignment frames 140 are in this case mechanically coupled to the first and second frame structure by means of one bridge 130 per frame structure 120. There is no direct mechanical coupling between the alignment frames 140 and the submounts by means of a bridge 130. The alignment holes 150 are elongated holes which are adapted to fit to alignment pins on the carrier. The elongation of the alignment pins is adapted to compensate at least a part of the relative movement of the alignment pins of the carrier. The alignment pins of the carrier may thus exert a force to the carrier structure 100 only after solidification of the solder, silver paste or the like used for thermal mating such that misalignment may be avoided.

Figure 4:
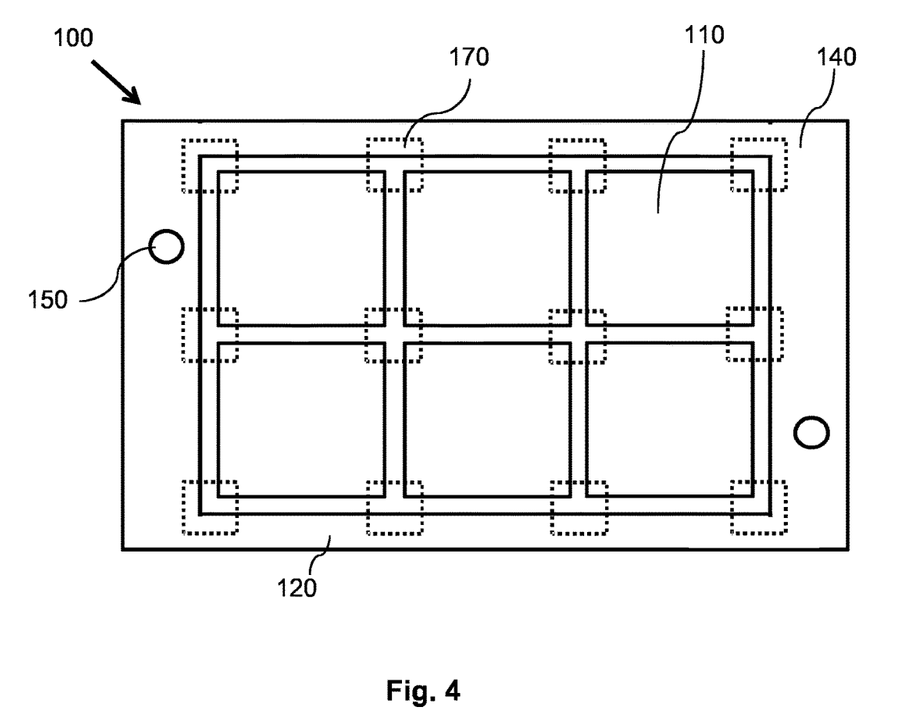
FIG. 4 shows a principal sketch of a fourth embodiment of a carrier structure.

FIG. 4 shows a principal sketch of a fourth embodiment of a carrier structure 100. The frame structures 120 and alignment frames 140 form in this case one connected frame around the submounts. Again two alignment holes 150 are provided at opposite sides of the frame. The six submounts are arranged in an array with two lines and three columns The mechanical coupling between the connected frame and submounts and between the submounts is provided by means of stabilizers 170 which are arranged at each corner of the quadratic submounts. The alignment structure comprises the connected frame and the stabilizers 170. The stabilizers 170 are made of plastic with a melting point below or slightly above the melting temperature of solder which may be used during thermal mating. The wetting of the molten plastic with respect to the material of the submounts and the carrier is preferably low. The stabilizer 170 may melt before the solder melts such that the submounts are released after aligning the submounts to the corresponding solder pads of the carrier. Alternatively, the stabilizers 170 may melt at a temperature slightly above the melting temperature of the solder such that the alignment of the sub carriers 110 is maintained until this temperature is reached during thermal mating.

Figure 5:
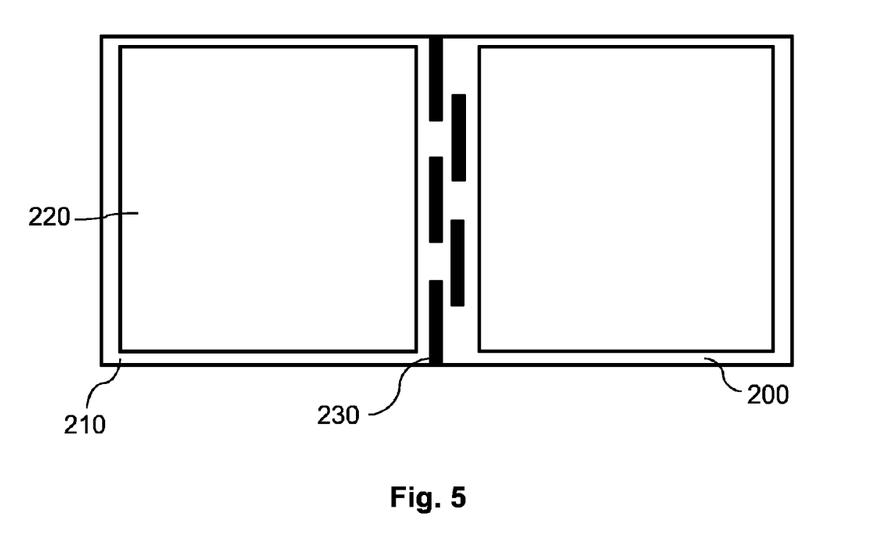
FIG. 5 shows a principal sketch of a top view of a fifth embodiment of a carrier structure.
Figure 6:
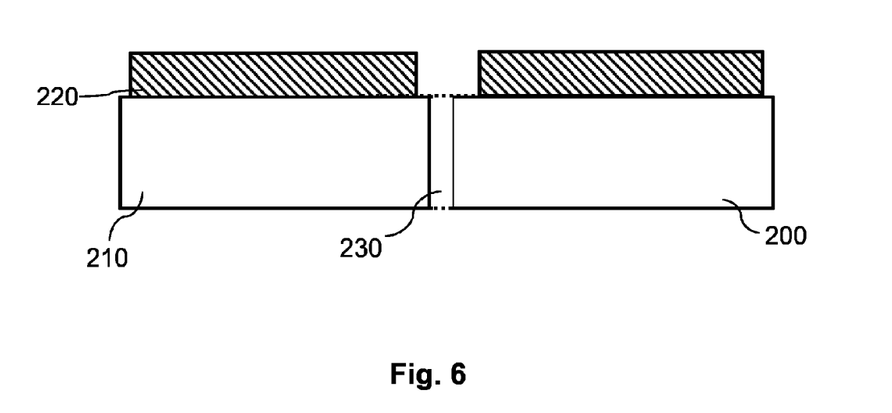
FIG. 6 shows a principal sketch of a cross section of the embodiment shown in FIG. 5

FIG. 5 shows a principal sketch of a top view of a fifth embodiment of a carrier structure 100. The carrier structure 200 is an integrated feature of a semiconductor chip. The semiconductor chip comprises two laser arrays 220 provided on two sub carriers 210. The carrier structure 200 comprises at least parts of a substrate of the semiconductor chip. A GaAs substrate of the semiconductor chip may be used for the carrier structure 200. Furthermore a part of the layer structure deposited on the GaAs substrate to finally form the VCSEL arrays may also be comprised by the carrier structure 200. The alignment structure comprises a breaking line 235 made of two columns of etched holes 230 between the first and the second sub carrier 220 such that the two VCSEL arrays provided on the sub carriers 220 are separated by means of the breaking line 235. The holes 230 of the two columns are elongated holes wherein the elongated holes of the first column are arranged staggered to the elongated holes of the second column. The elongated holes are provided across the complete GaAs substrate as shown in the cross section of the semiconductor chip of FIG. 5 in FIG. 6. An extension of the elongated holes in parallel to the column is bigger than a joint between two elongated holes of one column. The joints between two elongated holes of one column are arranged opposite to the center of an elongated hole of the other column. The sub carriers are therefore connected by means of narrow bridges with one elongated hole of the first column on one side and one elongated hole of the second column on the second side. The CTE mismatch between the semiconductor chip and the carrier causes a compressive stress on the semiconductor chip after solidification of the, for example, solder between solder pads of the carrier and solder pads of the semiconductor chip. The narrow bridges break after cooling down to a threshold temperature and the joints of the first column slide in a corresponding elongated hole of the second column and vice versa. The sub carriers 220 can thus approach each other because of the higher CTE of the carrier without touching each other.

Figure 7:
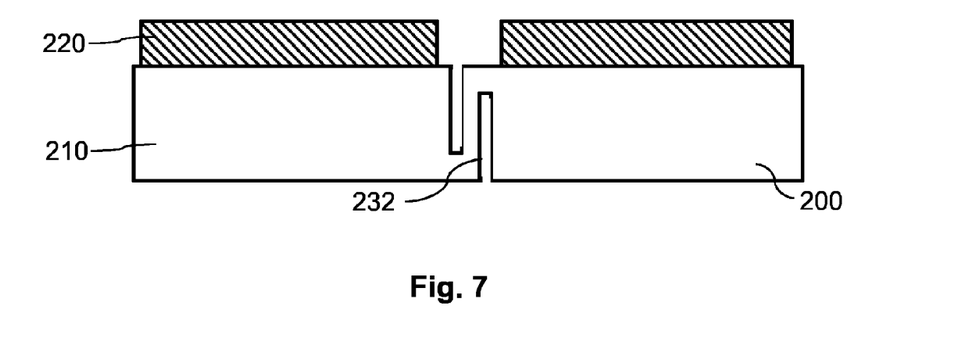
FIG. 7 shows a principal sketch of a cross section of a sixth embodiment of a carrier structure.

FIG. 7 shows a principal sketch of a cross section of a sixth embodiment of a carrier structure 200. The semiconductor chip comprise at least two trenches 232, a first trench 232 is diced in the light emitting side of the semiconductor chip and a second trench 232 is diced in the side opposite to the light emitting side of the semiconductor chip in parallel to the first trench 232. Both trenches 232 overlap within the substrate. The overlapping part of the trenches forms a narrow bridge with one trench 232 on one side and another trench 232 on the other side. The narrow bridge is arranged to break after solidification of sintered silver paste which is used to thermally mate the semiconductor chip to a submount with higher CTE as the GaAs substrate. The submount is used as carrier. The residuals of the breaking line 235 are enabled to slide one above another essentially without touching each other until thermal equilibrium is reached. Any coatings on the epitaxy side like metalization or polyimide protection should be opened in the vicinity of the trenches 232 in order to allow a clear breaking of the crystalline GaAs. The width of the breaking line 235 must be large enough to allow for sufficient space to avoid issues due to the CTE mismatch. They must allow free movement of the sub carriers 210 such that mechanical stress is primarily built up at the narrow bridges. The embodiments shown in FIGS. 5-7 can obviously be used for a multitude of sub carriers in linear or two dimensional array arrangements.

Figure 8:
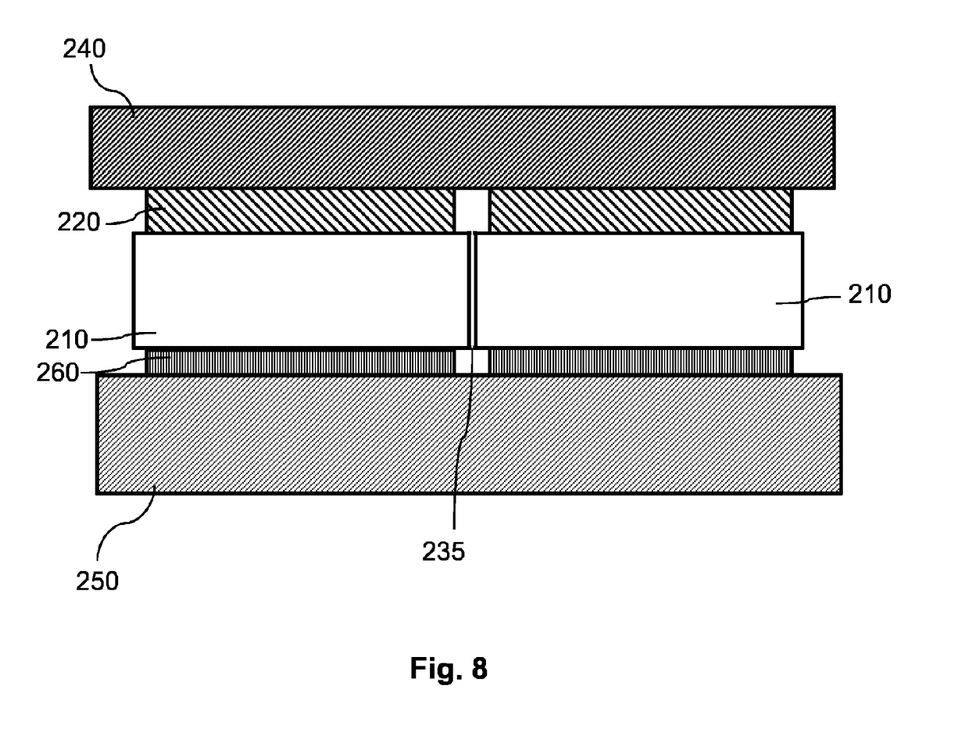
FIG. 8 shows a principal sketch of a cross section of a first embodiment of a semiconductor lighting module.

FIG. 8 shows a principal sketch of a cross section of a first embodiment of a semiconductor lighting module. A carrier structure 200 was soldered on solder pads with solder 260 on a heat sink 250 (microchannel cooler) used as carrier. A typical solder used in the solder step is lead free solder (SAC). During the soldering procedure the solder will become solid at its melting temperature (e.g. for SAC at a temperature around 200° C.). When further cooling down, the size of the carrier structure 200 decreases slower than the size heat sink 250 due to the difference in CTE. Mechanical stress will be built up which lead to breaking of the bridging structures of the breaking line 235 of the carrier structure 200. The distance between the sub carriers 210 in this case parts of the semiconductor chips with two laser arrays 220 in the semiconductor lighting module is thus smaller than on the sub carrier 200 prior to soldering. The different distance between the laser arrays 220 has thus to be taken into account during the design of the sub carrier 200 (semiconductor chip). Furthermore, the width of the breaking line 235 has to be arranged such that after soldering a narrow gap between the sub carriers 210 remains. Finally, a common microlens array 240 was attached to the VCSEL arrays 220. The alignment of the VCSEL arrays by means of the common carrier structure 200 during the soldering process enables use of the common microlens array 240 because the VCSEL arrays 220 are automatically aligned. No misalignment has to be compensated by means of separate micro lens arrays for each VCSEL array.

Figure 9:
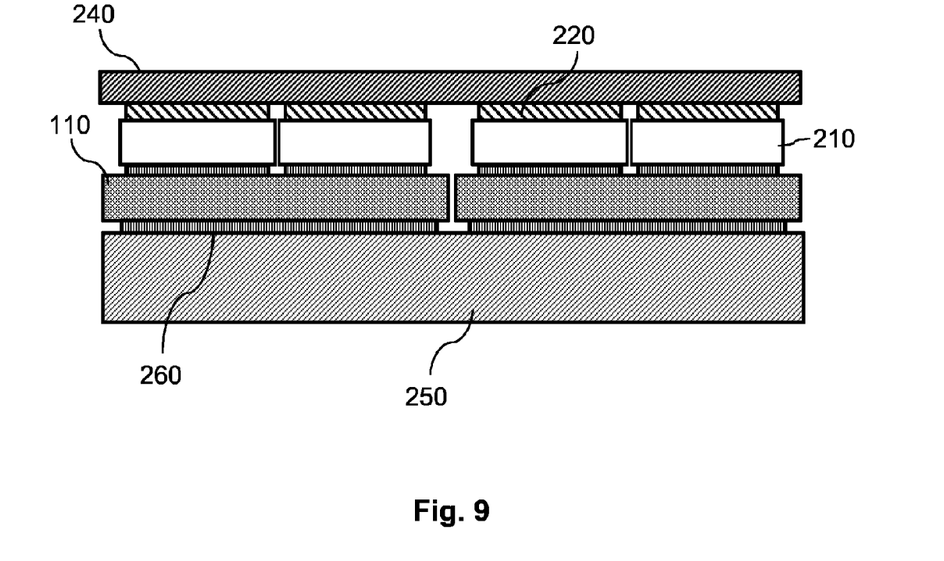
FIG. 9 shows a principal sketch of a cross section of a second embodiment of a semiconductor lighting module.

FIG. 9 shows a principal sketch of a cross section of a second embodiment of a semiconductor lighting module. The principal of automatic alignment by means of carrier structures 100, 200 can is extended. Four laser arrays 220 are indirectly attached to a heat sink 250. Sub carriers 210 comprising parts of a semiconductor chip each with one laser array 220 are soldered to a submount wherein the submount again is a sub carrier 110 of a carrier structure 100. Furthermore, two submounts with two laser arrays are thermally mated to one common heat sink 250. The submounts and laser arrays 220 were automatically aligned during soldering such that one common micro lens array is attached to the four laser arrays. The design of the sub carriers 100, 200 is adapted to compensate the contraction caused by the heat sink 250 and the carrier structure 100 comprising the submounts. The CTE of the heat sink is higher as the CTE of carrier structure 100 comprising the submounts, and the CTE of carrier structure 100 comprising the submounts is higher than the CTE of the carrier structure 200 comprising the parts of the semiconductor chips with the VCSEL arrays.

In many semiconductor lighting modules like high power VCSEL modules a number of submounts is put to one heat sink 250. The VCSEL arrays 220 and the submounts are then connected to each other using wirebonds. Today the wirebonding is done after the 2nd solder step of the submounts with the laser arrays 220 on the heat sink 250. Using carrier structures 100, 200 enable wirebonding after the 1st solder step on submount level which offers a further option to increase the speed of assembly.

Figure 10:
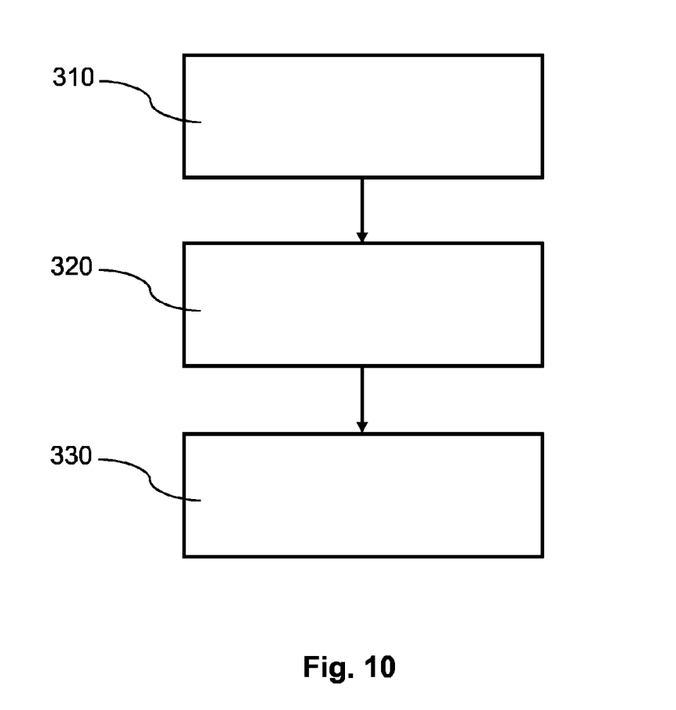
FIG. 10 shows a principal sketch of method steps of a method of manufacturing a semiconductor lighting module.

FIG. 10 shows a principal sketch of method steps of a method of manufacturing a semiconductor lighting module. In step 310 a carrier structure 100, 200 comprising at least two sub carriers 110, 210 and an alignment structure 120, 130, 230, 232 mechanically coupling the sub carriers 110, 210 is provided. The alignment structure 120, 130, 230, 232 is adapted such that the mechanical coupling to at least a part of the sub carriers 110, 210 disappears during thermal mating the carrier structure 100, 200 on a carrier 110, 250. The alignment structure 120, 130, 230, 232 is further arranged to compensate a coefficient of thermal expansion of a material of the carrier 110, 250 being higher than a coefficient of thermal expansion of a material of the carrier structure 100, 200. In step 320 at least two semiconductor light sources 220 are provided on the sub carriers 110, 210. In step 330 the carrier structure 100, 200 is thermally mated to the carrier 110, 250.

The current invention enables use of CTE mismatch between heat sink 250, submounts and semiconductor chips to enable an intrinsic alignment of laser arrays 220, submounts and heat sink 250. One common optical device like a micro lens array may be attached to a multitude of laser array instead of one microlens array per laser array 220. Aligning of separate microlens arrays may thus be avoided. Furthermore, wirebonding may be simplified. The effort of assembling a semiconductor lighting module like a high power VCSEL module may thus be simplified.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100, 200 carrier structure
110, 210 sub carrier
120 frame structure
130 bridge
140 alignment frame
150 alignment hole
170 stabilizer
220 laser array
230 hole
232 trench
235 breaking line
240 microlens array
250 heat sink
260 solder
310 step of providing carrier structure
320 step of providing semiconductor light sources
330 step of thermal mating

The invention claimed is:

1. A carrier structure for assembling a semiconductor lighting module comprising:
at least two sub carriers and an alignment structure, the alignment structure mechanically coupling the sub carriers,
wherein the alignment structure is arranged such that the mechanical coupling to at least a part of the sub carriers disappears during thermal mating of the carrier structure to a carrier,
wherein the alignment structure is arranged to compensate for a coefficient of thermal expansion of a material of the carrier,
wherein the thermal expansion of the material of the carrier is higher than a coefficient of thermal expansion of a material of the carrier structure,
wherein the sub carriers are submounts for mounting semiconductor light sources,
wherein the alignment structure comprises at least one first frame structure,
wherein the at least one frame structure comprises at least one first bridge, for each submount,
wherein the alignment structure mechanically couples the submounts to the first frame structure such that the submounts are arranged in parallel to the first frame structure,
wherein the at least one first bridge is arranged to break during thermal mating the carrier structure to the carrier if thermal stress exerted on the at least one first bridge exceeds a threshold value,
wherein at least one second frame structure comprises at least one second bridge for each submount,
wherein the alignment structure mechanically couples the submounts to the second frame structure such that the submounts are arranged in parallel to the second frame structure,
wherein the at least second bridge is arranged to break during thermal mating the carrier structure to the carrier if thermal stress exerted on the at least second bridge exceeds a threshold value.

2. A semiconductor chip comprising the carrier structure according to claim 1, the semiconductor chip comprising semiconductor light sources disposed on the sub carriers, wherein the carrier structure comprises at least parts of a substrate of the semiconductor chip and the alignment structure comprises a breaking line between at least a first sub carrier and a second sub carrier.

3. The semiconductor chip according to claim 2, wherein the alignment structure comprises holes in the substrate.

4. The semiconductor chip according to claim 2, wherein the alignment structure comprises trenches in the substrate.

5. The semiconductor chip according to claim 4,
wherein a first trench is provided at the light emitting side of the semiconductor chip,
wherein a second trench is provided at the side opposite to the light emitting side of the semiconductor chip in parallel to the first trench,
wherein the depth of the first and the second trench is arranged such that both trenches overlap within the substrate.

6. A method of manufacturing a semiconductor lighting module, the method comprising the steps of:
providing a carrier structure comprising at least two sub carriers,
wherein an alignment structure is mechanically coupled to the sub carriers,
wherein the alignment structure is arranged such that the mechanical coupling to at least a part of the sub carriers disappears during thermal mating the carrier structure on a carrier, wherein the alignment structure is arranged to compensate for a coefficient of thermal expansion of a material of the carrier being higher than a coefficient of thermal expansion of a material of the carrier structure,
wherein the sub carriers are submounts for mounting semiconductor light sources,
wherein the alignment structure comprises at least one first frame structure,
wherein the at least one frame structure comprises at least one first bridge, for each submount,
wherein the alignment structure mechanically couples the submounts to the first frame structure such that the submounts are arranged in parallel to the first frame structure,
wherein the at least one first bridge is arranged to break during thermal mating the carrier structure to the carrier if thermal stress exerted on the at least one first bridge exceeds a threshold value,
wherein at least one second frame structure comprises at least one second bridge for each submount,
wherein the alignment structure mechanically couples the submounts to the second frame structure such that the submounts are arranged in parallel to the second frame structure,
wherein the at least second bridge is arranged to break during thermal mating the carrier structure to the carrier if thermal stress exerted on the at least second bridge exceeds a threshold value,
providing at least two semiconductor light sources on the sub carriers; and
thermal mating the carrier structure to the carrier.

7. A semiconductor chip comprising:
a carrier structure, the carrier structure comprising at least two sub carriers and an alignment structure, the alignment structure mechanically coupling the sub carriers; and
semiconductor light sources disposed on the sub carriers,
wherein the carrier structure comprises at least parts of a substrate of the semiconductor chip and the alignment structure comprises a breaking line between at least a first sub carrier and a second sub carrier,
wherein the alignment structure is arranged such that the mechanical coupling to at least a part of the sub carriers disappears during thermal mating of the carrier structure to a carrier,
wherein the alignment structure is arranged to compensate for a coefficient of thermal expansion of a material of the carrier,
wherein the thermal expansion of the material of the carrier is higher than a coefficient of thermal expansion of a material of the carrier structure,
wherein the alignment structure comprises holes in the substrate,
wherein the holes are provided along at least two parallel lines and the holes of the first line are arranged staggered with respect to the holes of the second line,
wherein an extension of the holes in parallel to the lines is bigger than a joint between two holes in the lines such that the joints of the first line can slide in a corresponding hole of the second line and joints of the second line can slide in a corresponding hole of the first line during thermal mating the carrier structure to the carrier.

8. The semiconductor chip according to claim 7, wherein the alignment structure comprises trenches in the substrate.

9. The semiconductor chip according to claim 8,
wherein a first trench is provided at the light emitting side of the semiconductor chip,
wherein a second trench is provided at the side opposite to the light emitting side of the semiconductor chip in parallel to the first trench,
wherein the depth of the first trench and the second trench is arranged such that both trenches overlap within the substrate.

10. The semiconductor chip according to claim 7, wherein the semiconductor light sources comprise at least two laser arrays provided on the different sub carriers.

11. The semiconductor lighting module comprising at least two sub carriers of the carrier structure according to claim 7 thermally mated to a heat sink and at least two semiconductor light sources provided on different sub carriers.

12. The semiconductor lighting module according to claim 11, comprising an optical device disposed on top of the light emitting side of the semiconductor light sources.

13. The semiconductor lighting module according to claim 12, wherein the optical device is a microlens array.

14. A carrier structure for assembling a semiconductor lighting module comprising:
at least two sub carriers and an alignment structure, the alignment structure mechanically coupling the sub carriers; and
at least one first alignment frame, the first alignment frame having at least one third alignment hole and at least one third bridge, wherein the at least one third bridge mechanically couples the at least one submount or the at least one frame structure to the first alignment frame,
wherein the alignment structure is arranged such that the mechanical coupling to at least a part of the sub carriers disappears during thermal mating of the carrier structure to a carrier,
wherein the alignment structure is arranged to compensate for a coefficient of thermal expansion of a material of the carrier,
wherein the thermal expansion of the material of the carrier is higher than a coefficient of thermal expansion of a material of the carrier structure,
wherein the sub carriers are submounts for mounting semiconductor light sources,
wherein the alignment structure comprises at least one first frame structure,
wherein the at least one frame structure comprises at least one first bridge, for each submount,
wherein the alignment structure mechanically couples the submounts to the first frame structure such that the submounts are arranged in parallel to the first frame structure,
wherein the at least one first bridge is arranged to break during thermal mating the carrier structure to the carrier if thermal stress exerted on the at least one first bridge exceeds a threshold value.

15. A semiconductor chip comprising the carrier structure according to claim 14, the semiconductor chip comprising semiconductor light sources disposed on the sub carriers, wherein the carrier structure comprises at least parts of a substrate of the semiconductor chip and the alignment structure comprises a breaking line between at least a first sub carrier and a second sub carrier.

16. The semiconductor chip according to claim 15, wherein the alignment structure comprises holes in the substrate.

17. The semiconductor chip according to claim 15, wherein the alignment structure comprises trenches in the substrate.

18. The semiconductor chip according to claim 17,
wherein a first trench is provided at the light emitting side of the semiconductor chip,
wherein a second trench is provided at the side opposite to the light emitting side of the semiconductor chip in parallel to the first trench,
wherein the depth of the first and the second trench is arranged such that both trenches overlap within the substrate.

19. A carrier structure for assembling a semiconductor lighting module comprising:
at least two sub carriers and an alignment structure, the alignment structure mechanically coupling the sub carriers;
at least one first alignment frame, the first alignment frame having at least one third alignment hole and at least one third bridge, wherein the at least one third bridge mechanically couples the at least one submount or the at least one frame structure to the first alignment frame; and
a second alignment frame, the second alignment frame having at least one fourth alignment hole, wherein the at least one fourth bridge mechanically couples the at least one submount or the at least one frame structure to the second alignment frame,
wherein the alignment structure is arranged such that the mechanical coupling to at least a part of the sub carriers disappears during thermal mating of the carrier structure to a carrier,
wherein the alignment structure is arranged to compensate for a coefficient of thermal expansion of a material of the carrier,
wherein the thermal expansion of the material of the carrier is higher than a coefficient of thermal expansion of a material of the carrier structure,
wherein the sub carriers are submounts for mounting semiconductor light sources,
wherein the alignment structure comprises at least one first frame structure,
wherein the at least one frame structure comprises at least one first bridge, for each submount,
wherein the alignment structure mechanically couples the submounts to the first frame structure such that the submounts are arranged in parallel to the first frame structure,
wherein the at least one first bridge is arranged to break during thermal mating the carrier structure to the carrier if thermal stress exerted on the at least one first bridge exceeds a threshold value.

20. A semiconductor chip comprising the carrier structure according to claim 19, the semiconductor chip comprising semiconductor light sources disposed on the sub carriers, wherein the carrier structure comprises at least parts of a substrate of the semiconductor chip and the alignment structure comprises a breaking line between at least a first sub carrier and a second sub carrier.

21. The semiconductor chip according to claim 20, wherein the alignment structure comprises holes in the substrate.

22. The semiconductor chip according to claim 20, wherein the alignment structure comprises trenches in the substrate.

23. The semiconductor chip according to claim 22,
wherein a first trench is provided at the light emitting side of the semiconductor chip,
wherein a second trench is provided at the side opposite to the light emitting side of the semiconductor chip in parallel to the first trench,
wherein the depth of the first and the second trench is arranged such that both trenches overlap within the substrate.

* * * * *